(12) United States Patent
Lee et al.

(10) Patent No.: US 8,389,400 B2
(45) Date of Patent: Mar. 5, 2013

(54) METHOD OF MANUFACTURING FINE PATTERNS OF SEMICONDUCTOR DEVICE

(75) Inventors: Ki Lyoung Lee, Hwaseong-si (KR); Sa Ro Han Park, Yongin-si (KR)

(73) Assignee: Hynix Semiconductor Inc, Icheon-Si (KR)

( * ) Notice: Subject to any disclaimer, the term of this patent is extended or adjusted under 35 U.S.C. 154(b) by 379 days.

(21) Appl. No.: 12/650,222

(22) Filed: Dec. 30, 2009

(65) Prior Publication Data

US 2011/0124198 A1    May 26, 2011

(30) Foreign Application Priority Data

Nov. 26, 2009   (KR) .................. 10-2009-0115125

(51) Int. Cl.
*H01L 21/4763*   (2006.01)

(52) U.S. Cl. ................ 438/622; 438/623; 438/624

(58) Field of Classification Search .............. None
See application file for complete search history.

(56) References Cited

U.S. PATENT DOCUMENTS 7,473,647 B2 *   1/2009  Lee et al. .............. 438/706
7,842,601 B2 *   11/2010 Lee et al. .............. 438/622
2006/0240361 A1 * 10/2006 Lee et al. .............. 430/313
2009/0170336 A1   7/2009  Ban et al.

FOREIGN PATENT DOCUMENTS

| KR | 1020060110097 A | 10/2006 |
| KR | 1020090070473 A | 7/2009 |
| KR | 1020090072671 A | 7/2009 |
| KR | 1020090102549 A | 9/2009 |

\* cited by examiner

*Primary Examiner* — Duy Deo

(57) ABSTRACT

A method of forming fine patterns of a semiconductor device comprises forming sacrificial film patterns of a line type in a cell region of a semiconductor substrate and, at the same time, forming pad patterns in a peripheral region of the semiconductor substrate, forming a spacer on sidewalls of each of the sacrificial film patterns and the pad patterns, forming a gap-fill layer on sidewalls of the spacers to thereby form line and space patterns, including the sacrificial film patterns and the gap-fill layers, in the cell region, and separating the line and space patterns of the cell region at regular intervals and, at the same time, etching the pad patterns of the peripheral region to thereby form specific patterns in the peripheral region.

20 Claims, 15 Drawing Sheets

METHOD OF MANUFACTURING FINE PATTERNS OF SEMICONDUCTOR DEVICE

CROSS-REFERENCE TO RELATED APPLICATION

Priority to Korean patent application number 10-2009-0115125, filed on 26 Nov. 2009, which is incorporated by reference in its entirety, is claimed

BACKGROUND OF THE INVENTION

The present invention relates to a method of forming fine patterns of a semiconductor device and, more particularly, to a method of forming fine patterns of a semiconductor device, including a spacer patterning process.

Recently, with the increase in the degree of integration of semiconductor devices, the entire chip area is increased in proportion to an increase in the capacity of memory, but the area of a cell region in which the dense patterns of the memory cells are actually formed is reduced. To secure a desired capacity of a memory device, a greater number of patterns have to be formed within a limited cell region. Accordingly, the critical dimension of a pattern gradually decreases and becomes finer. To form a pattern having a fine critical dimension as described above, there is a need for the development of a lithography process.

The lithography process is used to form a photoresist pattern, defining fine patterns, by coating a photoresist over a substrate, performing an exposure process on the photoresist using an exposure mask having the fine patterns defined therein using a light source having a wavelength such as 365 nm, 248 nm, 193 nm, and 153 nm, and then performing a development process.

The resolution R of such a lithography process is determined by the equation $R=k1 \times \lambda/NA$ where '$\lambda$' is the wavelength of a light source, 'NA' is a numerical aperture, and 'k1' indicates a process constant. It is difficult to reduce the value of the process constant in a typical manner because the process constant has a physical limit. Accordingly, new photoresist materials having a high reactivity to the short wavelength light source have to be developed along with an exposure apparatus using the short wavelength. This makes it difficult to form a fine pattern reaching the critical dimension equal to the short wavelength or less.

For the above reason, there was developed a Double Patterning Technology (hereinafter referred to as a 'DPT') for forming fine patterns by performing the exposure process twice (dual exposure) using the same exposure mask without a change of the exposure apparatus or exposure conditions. Furthermore, a Spacer Patterning Technology (hereinafter referred to as a 'SPT'), which is similar to the DPT, but does not need dual exposure or dual patterning, was developed and is being researched.

FIG. 1 is a schematic diagram showing a conventional DPT. A positive DPT is shown on the left side of FIG. 1, and a negative DPT is shown on the right side of FIG. 1.

Referring first to the left side of FIG. 1, an amorphous carbon layer 120, a second hard mask layer 130, and a first hard mask layer 140 are sequentially formed over a semiconductor substrate 110. First photoresist patterns 152 of a line and space type are formed on the first hard mask layer 140. In the first photoresist patterns 152, the critical dimension ratio of a line and a space preferably is 1:3.

Next, the first hard mask layer 140 is etched using the first photoresist patterns 152 as a mask, thereby forming first hard mask patterns 142 of a line and space type. Second photoresist patterns 156 of a line and space type are formed between the first hard mask patterns 142 using a photolithography process. The second hard mask layer 130 is etched using the first hard mask patterns 142 and the second photoresist patterns 156 as a mask, thereby forming second hard mask patterns 132.

Here, the second hard mask patterns 132 are formed in a line and space pattern in which the critical dimension ratio of the line and space is 1:1. Accordingly, the second hard mask patterns 132, each having a half critical dimension as compared with the first photoresist pattern 152, can be obtained under the same exposure apparatus and conditions.

The negative DPT shown on the right side of FIG. 1 can also have the same effects as the positive DPT. The negative DPT is identical with the positive DPT except that the critical dimension of a line and a space in first photoresist patterns 154 and second photoresist patterns 158 is 3:1, and a detailed description thereof is omitted.

FIG. 2 is a schematic diagram showing a conventional spacer patterning process. A positive spacer patterning process is shown on the left side of FIG. 2, and a negative spacer patterning process is shown on the right side of FIG. 2.

Referring first to the left side of FIG. 2, an amorphous carbon layer 220, a second hard mask layer 230, and a first hard mask layer 240 are sequentially formed over a semiconductor substrate 220. First photoresist patterns 252 of a line and space type are formed on the first hard mask layer 240. The critical dimension ratio of the line and the space in the first photoresist patterns 252 preferably is 1:3.

Next, the first hard mask layer 240 is etched using the first photoresist patterns 252 as a mask, thereby forming first hard mask patterns 242 of a line and space type. A spacer 262 having the same width as the first hard mask pattern 242 is formed on the sidewalls of each of the first hard mask patterns 242. The first hard mask patterns 242 are then removed. The second hard mask layer 230 is etched using the remaining spacers 262 as a mask, thereby forming second hard mask patterns 232.

Here, the second hard mask patterns 232 are formed in a line and space pattern in which the critical dimension ratio of the line and the space is 1:1. Accordingly, the second hard mask patterns 232, each having a half critical dimension as compared with the first photoresist pattern 252, can be obtained under the same exposure apparatus and conditions.

The negative spacer patterning process shown on the right side of FIG. 2 can also have the same effects as the positive spacer patterning process. The negative spacer patterning process differs from the positive spacer patterning process in that, after forming spacers 264, a dielectric interlayer 270 is deposited, the spacers 264 are removed, and the second hard mask layer 230 is etched using the first hard mask patterns 244 and the dielectric interlayer 270 as a mask. That is, in the positive spacer patterning process, the final patterns having the same shape as the spacers are formed, whereas in the negative spacer patterning process, the final patterns having the same shape as the spaces with no spacer are formed.

Such a spacer patterning process is advantageous in that it can reduce the cost of production because an additional masking process is not required compared with the DPT and thus it can drastically reduce a misalignment problem occurring at the second masking step in the DPT. Accordingly, more active research is being carried on the spacer patterning process than on the DPT. However, even in a method of forming the fine patterns of a semiconductor device using the spacer patterning process, research are still carried out in order to further reduce the number of process steps.

BRIEF SUMMARY OF THE INVENTION

Various embodiments are directed to providing a method of forming the fine patterns of a semiconductor device, which is capable of reducing the manufacturing cost of semiconductor devices by completing patterning through only two mask processes in the negative spacer patterning process.

According to an embodiment of the present invention, a method of forming the fine patterns of a semiconductor device comprises forming sacrificial film patterns of a line type in a cell region of a semiconductor substrate and, at the same time, forming pad patterns in a peripheral region of the semiconductor substrate, forming a spacer on sidewalls of each of the sacrificial film patterns and the pad patterns, forming a gap-fill layer on sidewalls of the spacers to thereby form line and space patterns, including the sacrificial film patterns and the gap-fill layers, in the cell region, and separating the line and space patterns of the cell region at regular intervals and, at the same time, etching the pad patterns of the peripheral region to thereby form specific patterns in the peripheral region. As described above, since patterning is completed using only two mask processes, the manufacturing cost of semiconductor devices can be reduced.

The method further comprises, after the forming a gap fill layer on sidewalls of the spacers, removing the spacers. Accordingly, the sacrificial film pattern having a ½ critical dimension can be formed.

The method further comprises, after the separating the line and space patterns of the cell region at regular intervals and at the same time etching the pad patterns of the peripheral region, removing the spacers. Accordingly, it is preferred that the process of removing the spacers be omitted after forming the gap-fill layer. Here, the method preferably further comprises, after the forming a gap fill layer on sidewalls of the spacers, removing only a top surface of the spacers.

Furthermore, the forming a gap fill layer on sidewalls of the spacers comprises depositing the gap-fill layer over the semiconductor substrate having the spacers formed therein, and removing part of the gap-fill layer so that the gap-fill layer remains only on the sidewalls of the spacers.

Furthermore, the removing part of the gap fill layer preferably is performed using either dry etch or wet etch. The separating the line and space patterns of the cell region at regular intervals comprises removing the gap-fill layer remaining on the sidewalls of the sacrificial film patterns and on the sidewalls of the pad patterns in order to remove gap-fill polysilicon residue.

The method preferably further comprises, before the forming sacrificial film patterns and pad patterns, depositing an oxide layer over the semiconductor substrate.

The forming sacrificial film patterns and pad patterns comprises etching the oxide layer under the sacrificial film patterns and the pad patterns at a specific depth such that the etch selectivity of polysilicon complies with the etch selectivity of the oxide layer.

The forming a gap-fill layer on sidewalls of the spacers comprises depositing materials for the gap-fill layer over the spacers, and removing the materials for the gap-fill layer using etchback so that the gap-fill layer remains on the sidewalls of the spacers. Accordingly, the polysilicon pattern having a ½ critical dimension can be formed. Moreover, the sacrificial film pattern preferably comprises polysilicon.

The method further comprises forming trenches by etching the semiconductor substrate using the separated sacrificial film patterns and the etched pad patterns as a mask. The method further comprises depositing an amorphous carbon layer and a silicon oxynitride layer over the oxide layer such that they can be used as a hard mask.

The method preferably further comprises, before the depositing an oxide layer over the semiconductor substrate, depositing a pad oxide layer and a pad nitride layer over the semiconductor substrate.

Further, the peripheral region preferably comprises a core region in which a sense amp or a sense amp driver is formed.

Further, in the sacrificial film patterns of the line and space type, a critical dimension ratio of the line and the space is 1:3. Subsequently, the critical dimension is reduced using an SPT process.

The method further comprises, before the separating the sacrificial film patterns at regular intervals, forming a dielectric interlayer over the semiconductor substrate including the sacrificial film patterns and the pad patterns in order to polish the surface of the semiconductor substrate. The method further comprises forming an anti-reflection layer on the dielectric interlayer.

Furthermore, the critical dimension of a space formed between the sacrificial film pattern at the outermost portion of the sacrificial film patterns of the cell region and the pad patterns of the peripheral region is about 3 times greater than the critical dimension of the sacrificial film pattern such that the occurrence of polysilicon residue is prevented.

As described above, the method of forming the fine patterns of a semiconductor device according to some embodiments of the present invention provides an advantage of reducing the manufacturing cost of semiconductor devices by completing patterning through only two mask processes in the negative spacer patterning process.

DESCRIPTION OF EMBODIMENTS

Embodiments for forming the fine patterns of a semiconductor device according to the present invention are described below with reference to the accompanying drawings. Hereinafter, a process of forming trenches in order to form isolation layers, defining active regions, in a semiconductor substrate using a Shallow Trench Isolation (STI) process in the method of forming the fine patterns of a semiconductor device is described as an embodiment. It is, however, to be noted that the present invention is not limited to the embodiment defining the active regions as described above, but the isolation layer may be formed by forming line and spacer patterns and then cutting and separating the line and spacer patterns.

(1) Embodiment 1

Positive Spacer Patterning Process

FIGS. 3a to 3f are plan views showing a first embodiment according to a positive spacer patterning process in a method of forming the fine patterns of a semiconductor device according to the present invention.

Figure 1:
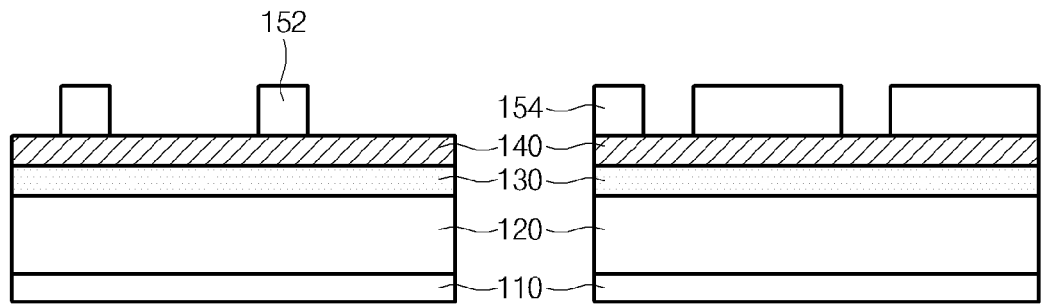
FIG. 1 is a diagram showing a conventional DPT.
Figure 1:
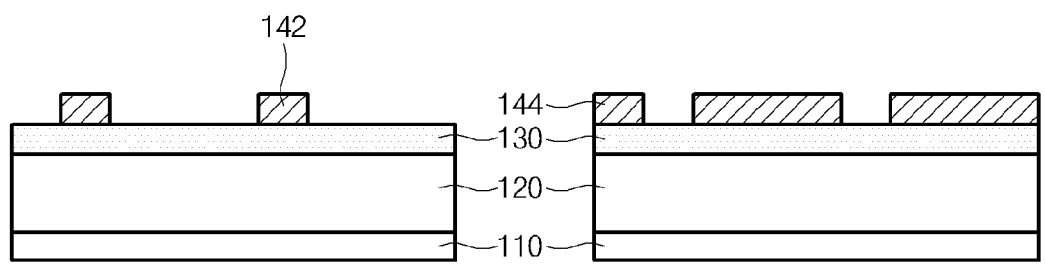
Figure 1:
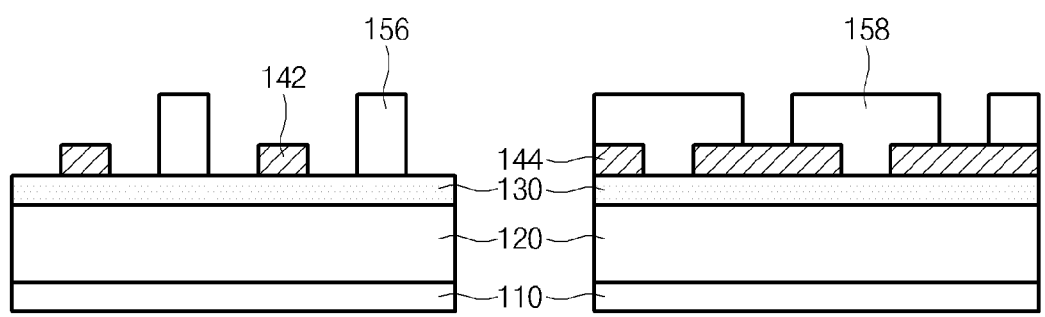
Figure 1:
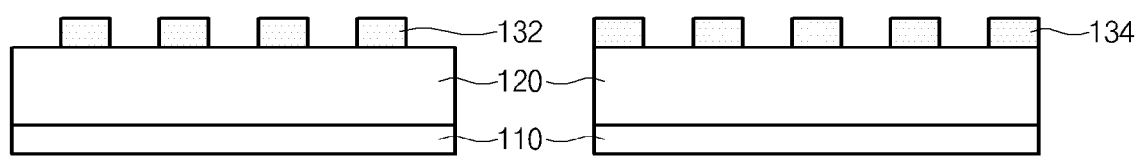
Figure 2:
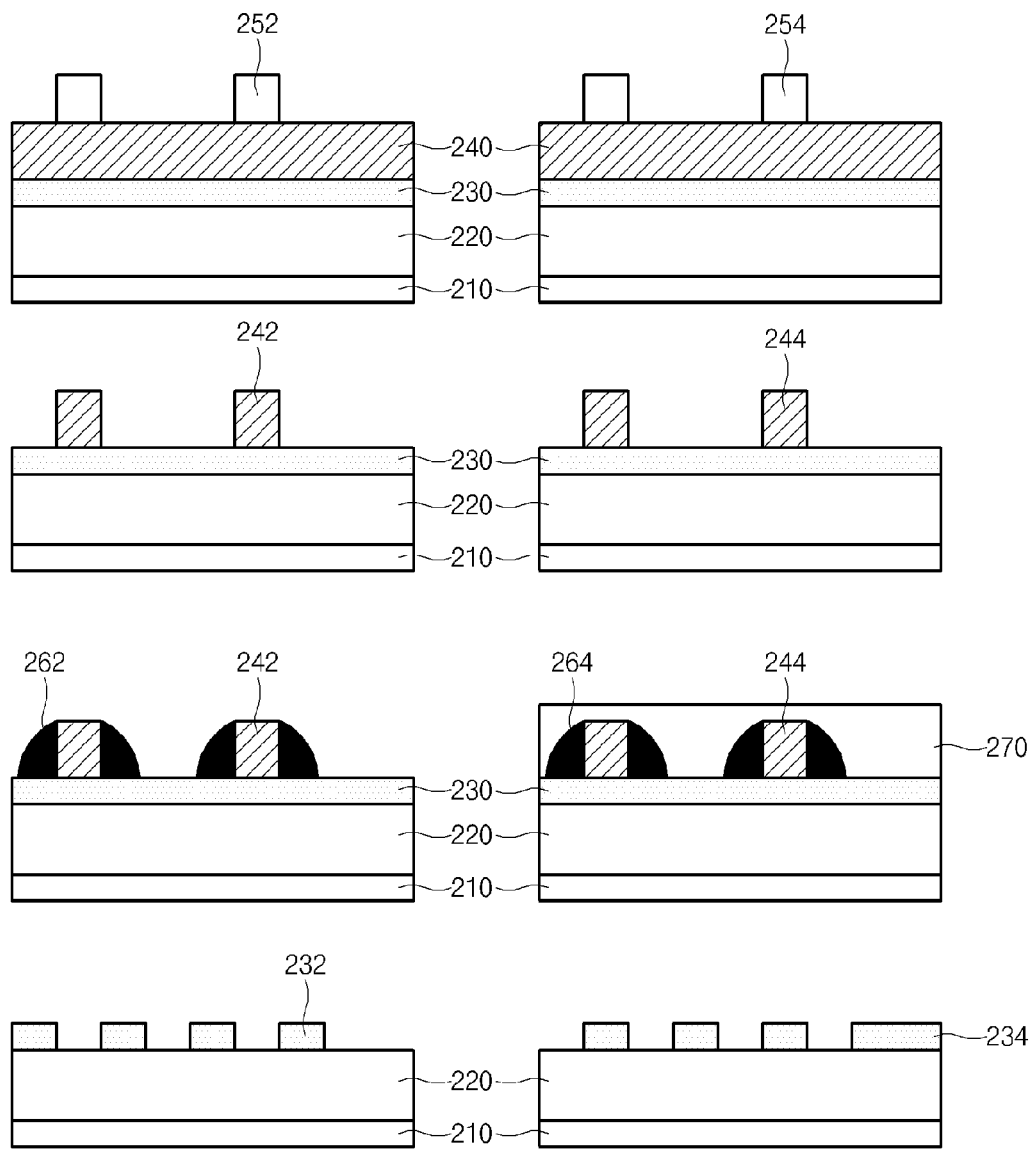
FIG. 2 is a diagram showing a conventional spacer patterning process.
Figure 3A:
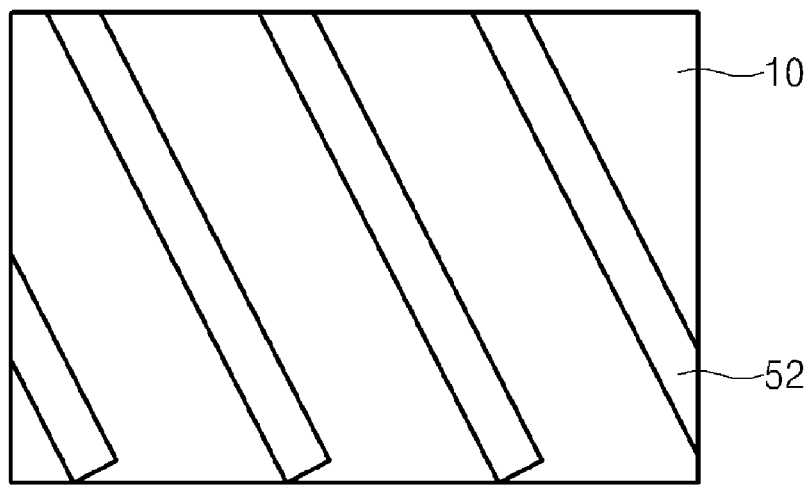
FIGS. 3a to 3f are plan views showing a first embodiment according to a positive spacer patterning process in a method of forming the fine patterns of a semiconductor device according to the present invention.

Referring first to FIG. 3a, cell masks 52 are formed over a semiconductor substrate 10. The cell masks 52 are formed in the cell regions of the semiconductor substrate 10 in a line and space type. The cell masks 52 may be patterns made of photoresist materials or hard mask patterns made of materials, such as nitrides or amorphous carbon. Here, a variety of hard mask layers and sacrificial layers are formed over the semiconductor substrate 10 (refer to FIG. 5a), but are omitted in FIG. 3a, for convenience of description.

Figure 3B:
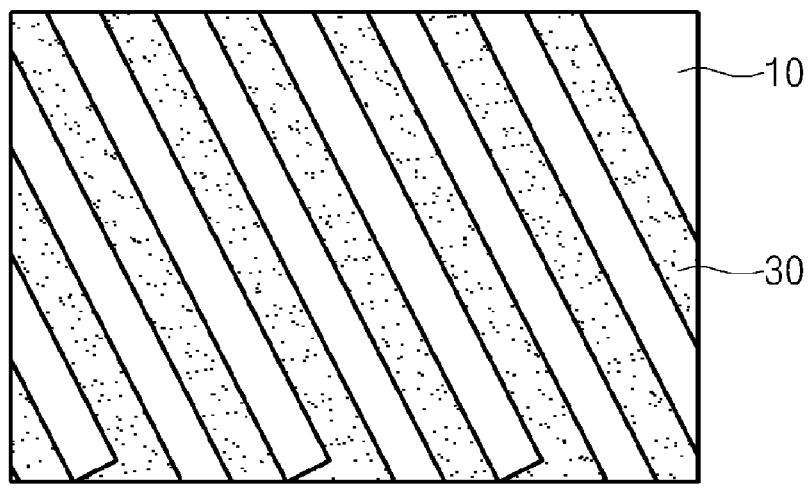

As shown in FIG. 3b, an underlying layer (not shown) is etched using the cell masks 52 as a mask, thereby forming sacrificial film patterns (not shown) having the same shape as the cell masks 52. The cell masks 52 are then removed. An oxide layer (not shown) (i.e., spacer material) is deposited on the entire surface of the semiconductor substrate 10, including the sacrificial film patterns. The oxide layer is removed by etchback, but a spacer oxide layer 30 remains on the sidewalls of each of the sacrificial film patterns. Next, the sacrificial film patterns are etched and removed.

Figure 3C:
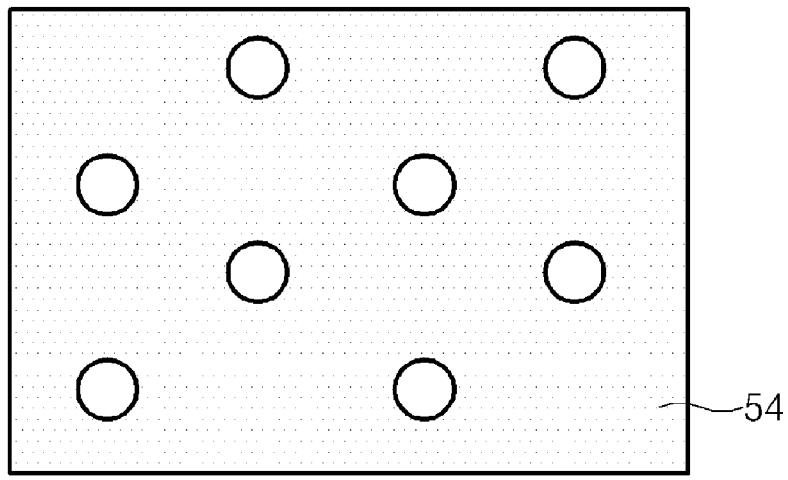

Referring to FIG. 3c, a cutting mask 54 for separating the spacer oxide layer 30 of a line type is formed on the upper side. The cutting mask 54 may be formed of a contact hole mask. The cutting mask 54 can be formed of a photoresist pattern or a hard mask pattern like the cell masks 52.

Figure 3D:
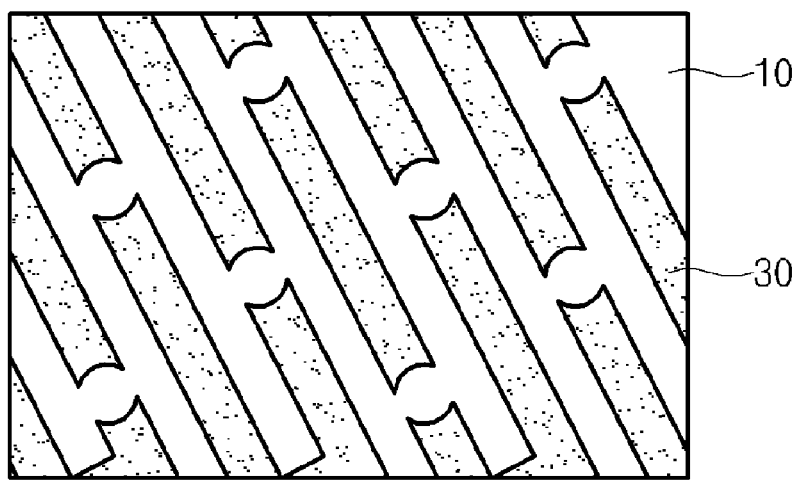

As shown in FIG. 3d, the spacer oxide layer 30 are etched using the cutting mask 54 as a mask, thereby cutting and separating the spacer oxide layer 30. The cutting mask 54 is then removed.

Figure 3E:
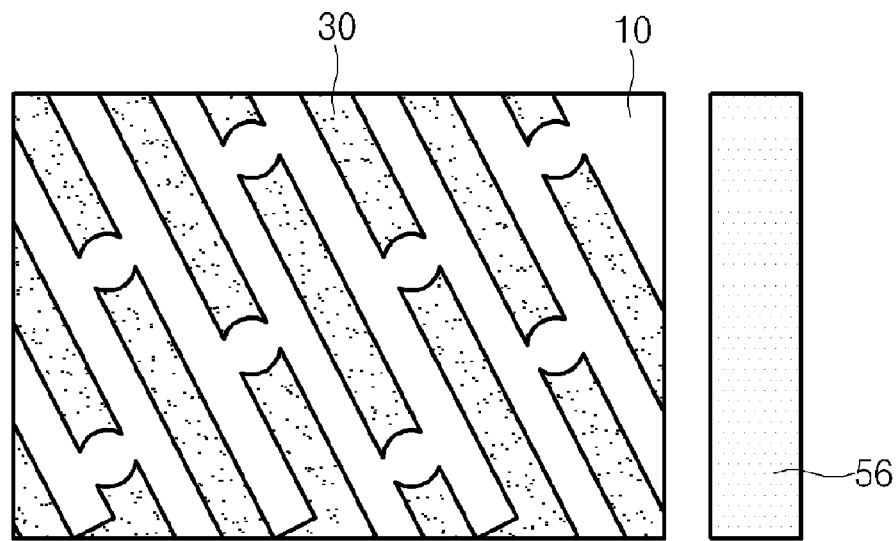

As shown in FIG. 3e, a peripheral mask 56 for forming peripheral patterns in a peripheral region is formed over a peripheral region of the substrate 10. The peripheral mask 56 may be formed of a photoresist pattern or a hard mask pattern like the cell masks 52 and the cutting mask 54.

Figure 3F:
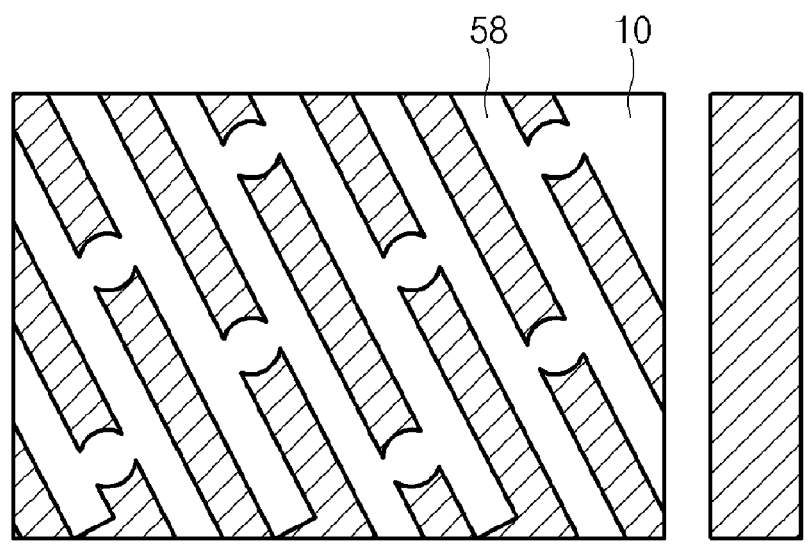

Referring to FIG. 3f, the semiconductor substrate 10 is etched using the spacer oxide layer 30 and the peripheral mask 56 as a mask, thereby forming trenches 58. Here, in the case in which a variety of hard mask layers (not shown) are formed over the semiconductor substrate 10, the trenches 58 are formed in the semiconductor substrate 10 while the hard mask layers are etched.

The positive spacer patterning process described so far according to the first embodiment includes many processes although a description of processes of depositing and etching various materials is omitted. Furthermore, the photomask process which occupies a significant portion of the manufacturing cost is performed three times (i.e., forming the cell masks in FIG. 3a, forming the cutting mask in FIG. 3c, and forming the peripheral mask in FIG. 3e). Accordingly, the existing method has reached the limit on reducing the primary cost of semiconductor devices. In addition, in the positive patterning process, since the spacer oxide layer 30 each having a narrow critical dimension become subsequent patterns, it is difficult to form a relatively wide pattern of a peripheral region using the spacer. Accordingly, to form line and space patterns of cell regions and peripheral patterns using the positive patterning process, a photomask process using three masks is needed.

(2) Embodiment 2

Negative Spacer Patterning Process 1

FIGS. 4a to 4j are cross-sectional views (a) and plan views (b) showing a second embodiment according to the negative spacer patterning process in the method of forming the fine patterns of a semiconductor device according to the present invention. According to the second embodiment to be described hereinafter, only two photomask processes are performed. Accordingly, the manufacturing cost can be reduced.

Figure 4A:
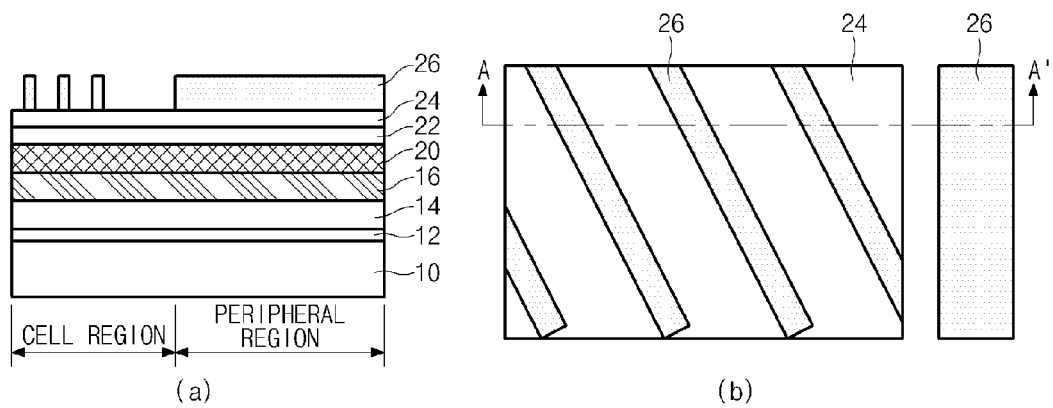
FIGS. 4a to 4j are cross-sectional views and plan views showing a second embodiment according to a negative spacer patterning process in the method of forming the fine patterns of a semiconductor device according to the present invention.

Referring first to FIG. 4a, a pad oxide layer 12 and a pad nitride layer 14 are sequentially stacked over a semiconductor substrate 10. An oxide layer (or target layer) 16, a polysilicon layer 20, an amorphous carbon layer 22, and a silicon oxynitride layer 24 are sequentially stacked over the pad nitride layer 14. Of them, the oxide layer 16 may be made of Plasma Enhanced Tetraethylorthosilicate (PETEOS) materials. Further, the amorphous carbon layer 22 and the silicon oxynitride layer 24 are made of materials functioning as a hard mask.

Photoresist patterns 26 are formed on the silicon oxynitride layer 24. The photoresist pattern of a line and space type is formed in a cell region, and the photoresist pattern of a pad type is formed in a peripheral region. In the photoresist pattern of the cell region, the critical dimension ratio of a line and a space is 1:3. For reference, the term 'peripheral region' described in the specification refers to a region including a core region in which a sense amp and a Sub-Wordline Driver (SWD) are formed.

Figure 4B:
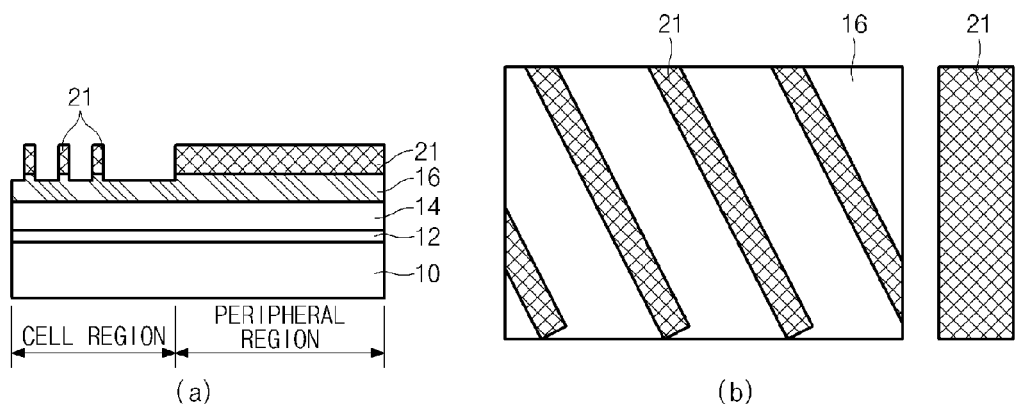

Referring to FIG. 4b, the silicon oxynitride layer 24, the amorphous carbon layer 22, and the polysilicon layer 20 are sequentially etched using the photoresist patterns 26 as a mask. Next, the photoresist patterns 26, the silicon oxynitride layer 24, and the amorphous carbon layer 22 are removed to thereby form polysilicon patterns 21. Because the amorphous carbon layer 22, the Silicon oxynitride layer 24 and the polysilicon layer 20 have different etch rate from one another, the amorphous carbon layer 22 and the Silicon oxynitride layer 24 can function as a hardmask for etching the polysilicon layer 20. The polysilicon pattern 21 is also called a 'sacrificial film pattern' because it plays the role of a sacrificial film in the spacer patterning process. The sacrificial film pattern 21 is formed to have a width equal to the critical dimension, and the sacrificial film pattern 21 of a cell region has the width ratio of a line and a space, which is 1:3. Further, when the polysilicon layer 20 is etched, part of the underlying oxide layer 16 may be etched to a specific thickness in order to make identical the etch selectivity of polysilicon with the etch selectivity of the oxide layer, which will be described later.

Figure 4C:
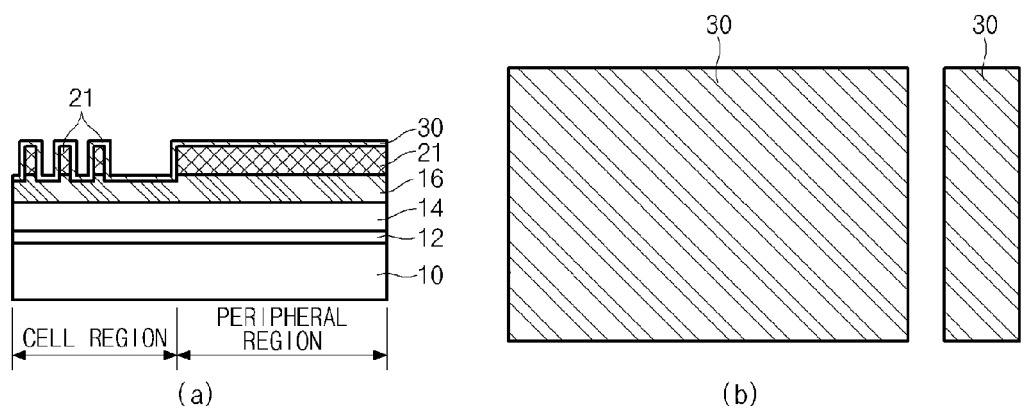

Referring next to FIG. 4c, a spacer oxide layer 30 is deposited to a specific thickness on the entire surface of the semiconductor substrate, including the sacrificial film patterns 21 and the oxide layer 16. Here, the width of the spacer oxide layer 30 is equal to the width of the sacrificial film pattern 21 of the cell region. Since the width of the sacrificial film pattern 21 is equal to the critical dimension, the width of a space (or a gap) between the neighboring sacrificial film patterns 21 becomes equal to the width of the sacrificial film pattern 21, i.e., as narrow as equal to the critical dimension. In this case, the spacer oxide layer 30 may be deposited using an Atomic Layer Deposition (ALD) process to improve the step coverage of the oxide layer.

Figure 4D:
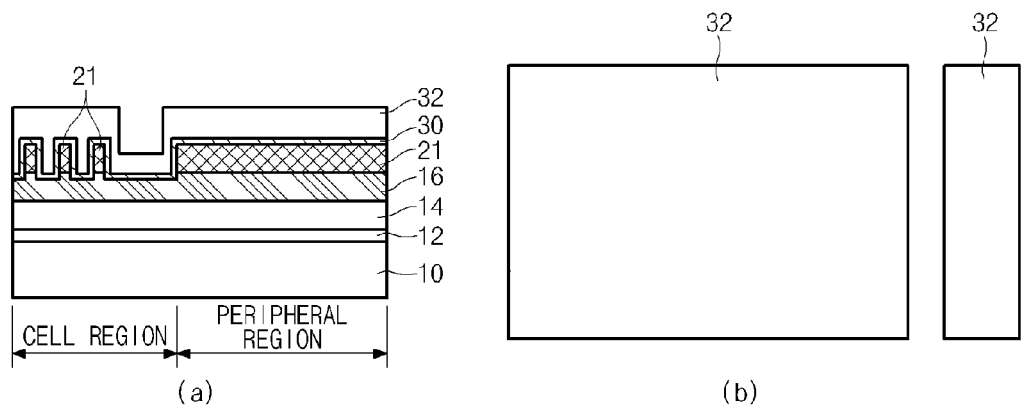

As shown in FIG. 4d, a gap-fill polysilicon layer 32 is deposited on the entire surface of the semiconductor substrate, including the spacer oxide layer 30. The gap-fill polysilicon layer 32 is made of the same polysilicon material as the sacrificial film patterns 21.

Figure 4E:
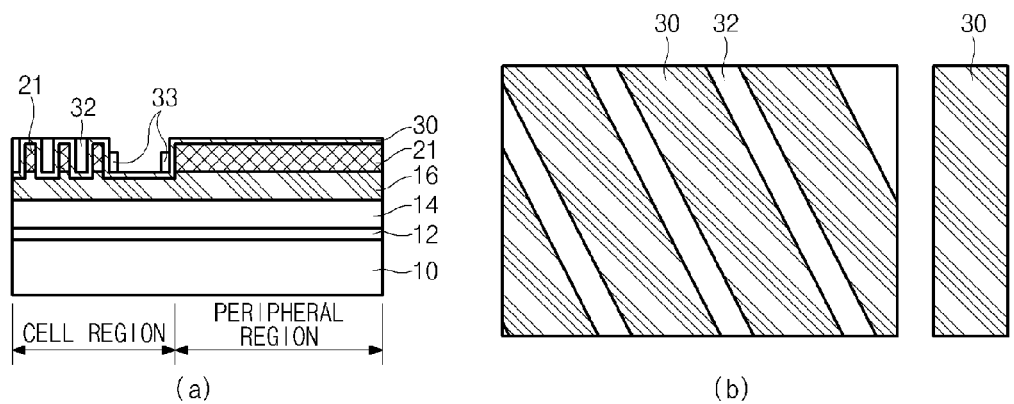

As shown in FIG. 4e, the gap-fill polysilicon layer 32 is subject to an etchback process so that the gap-fill polysilicon layers 32 (hereinafter referred to as 'gap-fill layers') fill the gap between the neighboring spacer oxide layers 30. The gap-fill layer 32 is formed to have the same width as the sacrificial film patterns 21, which is as narrow as equal to the critical dimension. On the other hand, gap-fill polysilicon residues 33 are formed on the sidewalls of the sacrificial film patterns 21 placed at the outer portion of the cell region, and on the sidewalls of the pad patterns 21 of the peripheral region, which needs to be subsequently removed. Besides the etchback method, the gap-fill layers 32 can be removed using various methods, such as Chemical Mechanical Polishing (CMP) and wet strip.

Figure 4F:
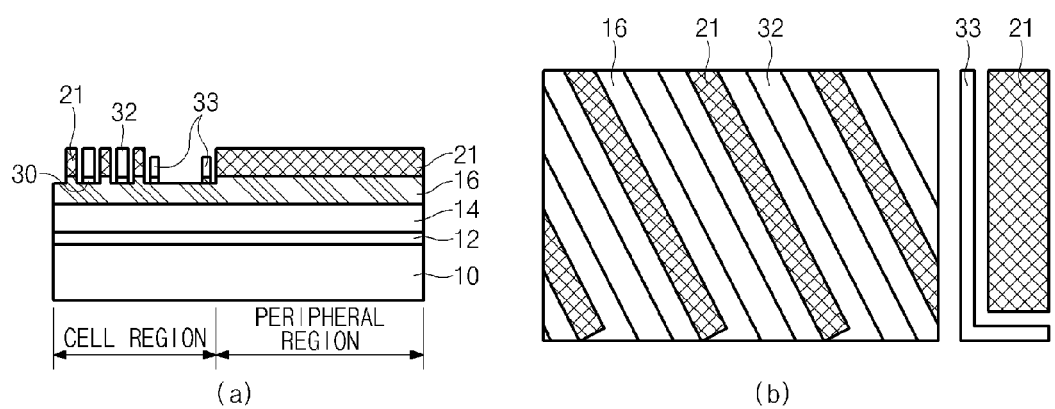

Referring to FIG. 4f, the spacer oxide layer 30 between the sacrificial film pattern 21 and the gap-fill layer 32, and the spacer oxide layer 30 between the sacrificial film pattern 21 and the gap-fill polysilicon residue 33 is removed. A dry etch process using a difference in the etch selectivity between the oxide layer 30 and the polysilicon materials 21, 32, 33 is used as a process of removing the spacer oxide layer 30. Even though the spacer oxide layer 30 between the sacrificial film pattern 21 and the gap-fill layer 32, and the spacer oxide layer 30 between the sacrificial film pattern 21 and the gap-fill polysilicon residue 33 is removed, the spacer oxide layer 30 still remains under the gap-fill layers 32.

Figure 4G:
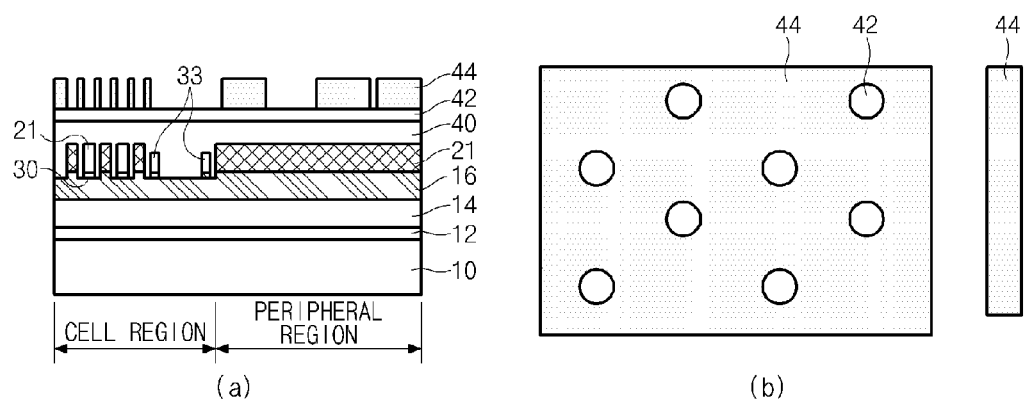

Referring to FIG. 4g, a dielectric interlayer 40 and an anti-reflection layer 42 are sequentially deposited over the entire surface of the semiconductor substrate, including the sacrificial film patterns 21. A photoresist pattern 44 is formed on the anti-reflection layer 42. The dielectric interlayer 40 is configured to polish the surface of the semiconductor substrate and may be formed of a Spin-On Carbon (SOC) layer. The anti-reflection layer 42 is configured to prevent the reflection of light in an exposure process and can be formed of material including silicon. Meanwhile, the photoresist pattern 44 functions to cut and separate the sacrificial film patterns 21 of a line and space type in the cell region and, as shown in (b) of FIG. 4g, which has a contact hole pattern. In the peripheral region, the photoresist pattern 44 functions to etch the polysilicon patterns 21 of a pad type and to pattern elements, such as a sense amplifier to be formed in the peripheral region. Further, the photoresist pattern 44 also functions to etch and remove the gap-fill polysilicon residue 33 formed outer sides of the cell region and the peripheral region.

Figure 4H:
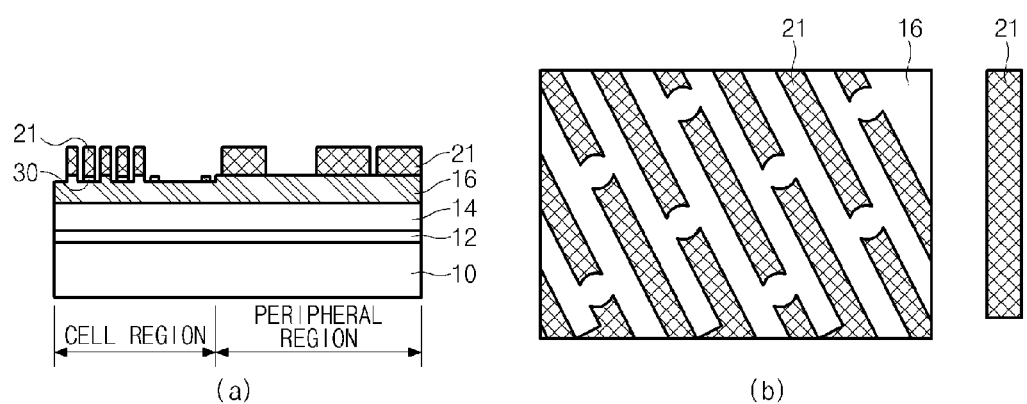
Figure 4I:
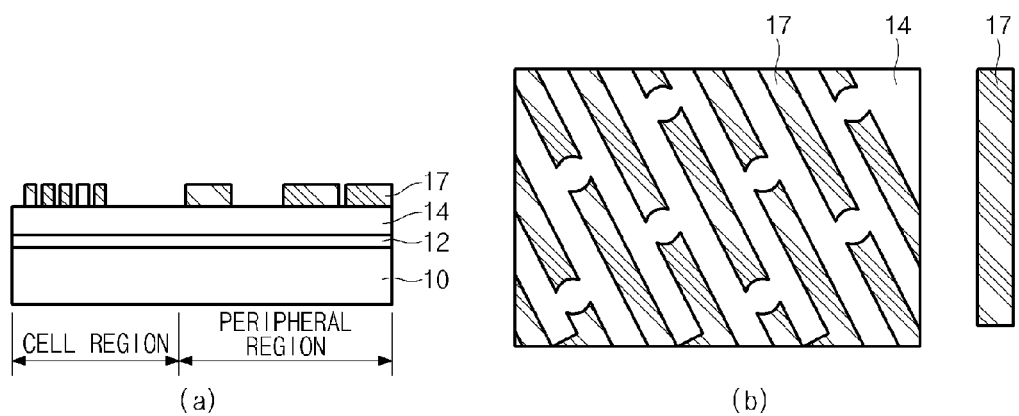

Referring to FIG. 4h, the anti-reflection layer 42, the dielectric interlayer 40, the sacrificial film patterns 21, and the gap-fill polysilicon residue 33 are sequentially etched using the photoresist pattern 44 as a mask. Consequently, the sacrificial film patterns 21 and the gap-fill layer 32 of a line and space type, placed in the cell region, are cut into several patterns, and the sacrificial film patterns 21 placed in the peripheral region are patterned in a specific fashion Referring to FIG. 4i, the oxide layer 16 is etched using the sacrificial film patterns 21 and the gap-fill layer 32 as a mask, thereby forming oxide layer patterns (or target pattern) 17. The sacrificial film patterns 21 and the gap-fill layer 32 are then removed.

Figure 4J:
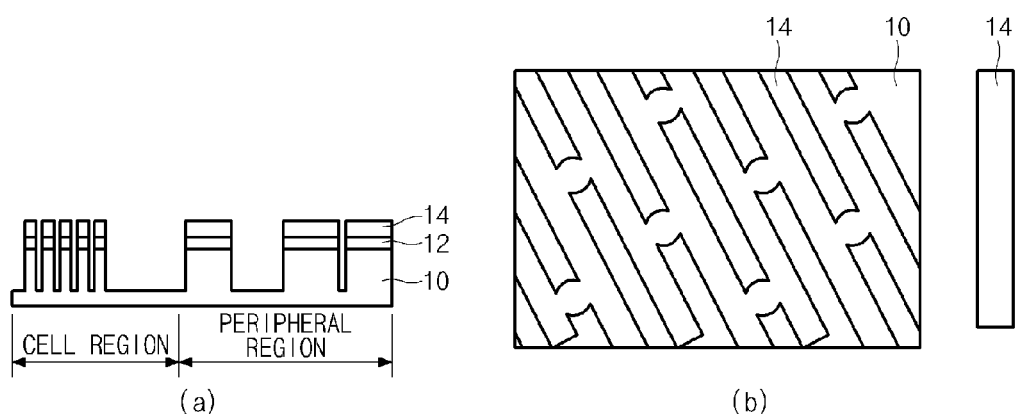

Referring to FIG. 4j, the pad nitride layer 14, the pad oxide layer 12, and the semiconductor substrate 10 are sequentially etched using the oxide layer pattern 17 as a mask, thereby forming trenches in the semiconductor substrate 10. Although not shown, the trenches formed in the semiconductor substrate 10 can be filled with an oxide layer, thereby forming isolation layers each separating the active regions.

In the case of the second embodiment 2 described so far, only two photomask processes are used in forming the trenches in the cell region and the peripheral region of the semiconductor substrate using the negative spacer patterning process. In more detail, the photomask process is necessary only in the process of forming the photoresist patterns 26 shown in FIG. 4a and the process of forming the photoresist pattern 44 shown in FIG. 4g.

This is because, as shown in FIG. 4a, when the photoresist patterns 26 are formed in cell regions, the photoresist patterns 26 in the peripheral region is concurrently formed. Another reason is because the gap-fill polysilicon residue 33 (refer to FIG. 4e) can be easily removed by the photoresist pattern 44 as a mask. Further, when the sacrificial film patterns 21 are formed, the oxide layer 16 is also etched to a certain thickness (refer to FIG. 4b). Accordingly, when the sacrificial film patterns 21 are cut, an etch target is identical with 'the polysilicon 21+the oxide layers 16, 30' and can be cut through one etch process. The method of forming the fine patterns of a semiconductor device according to the second embodiment of the present invention can reduce the manufacturing cost of a semiconductor device.

(3) Embodiment 3

Negative Spacer Patterning Process 2 (Remove Upper Portion of Oxide Layer Spacer)

FIGS. 5a to 5d are cross-sectional views and plan views showing a third embodiment according to a negative spacer patterning process in the method of forming the fine patterns of a semiconductor device according to the present invention. According to the third embodiment to be described below, the manufacturing cost can be reduced by reducing two steps of a photomask process while the negative spacer patterning process is used.

Figure 5A:
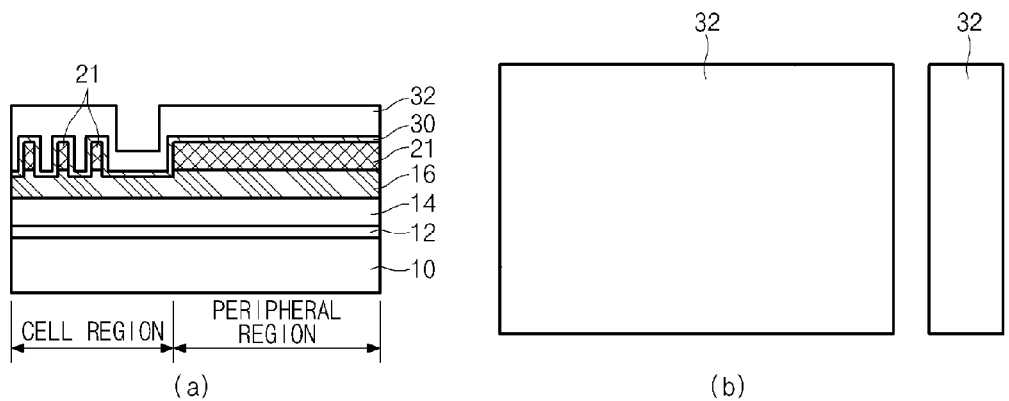
FIGS. 5a to 5d are cross-sectional views and plan views showing a third embodiment according to a negative spacer patterning process in the method of forming the fine patterns of a semiconductor device according to the present invention.
Figure 5B:
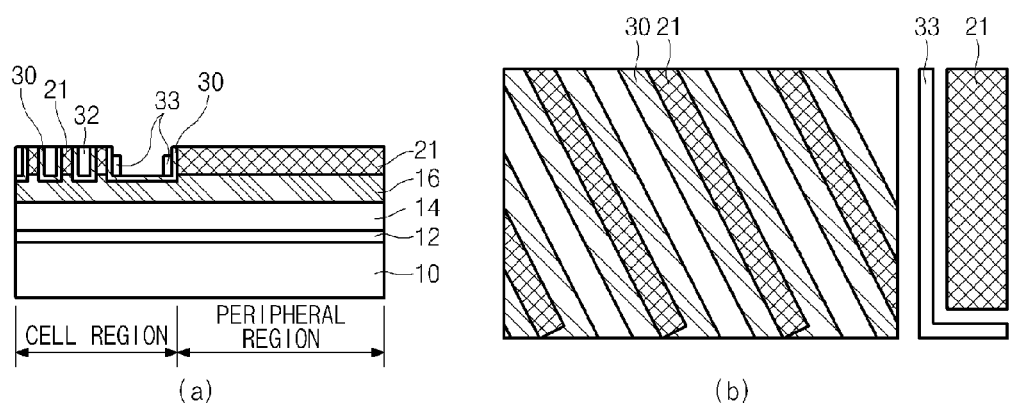

FIG. 5a is identical with FIG. 4d. Processes prior to FIG. 5a are the same as those described with reference to FIGS. 4a to 4d. Next, as shown in FIG. 5b, after the gap-fill layer 32 is subject to the etchback, the spacer oxide layer 30 and the gap-fill layer 32 are further subject to an etchback process until the polysilicon pattern 21 is exposed.

Figure 5C:
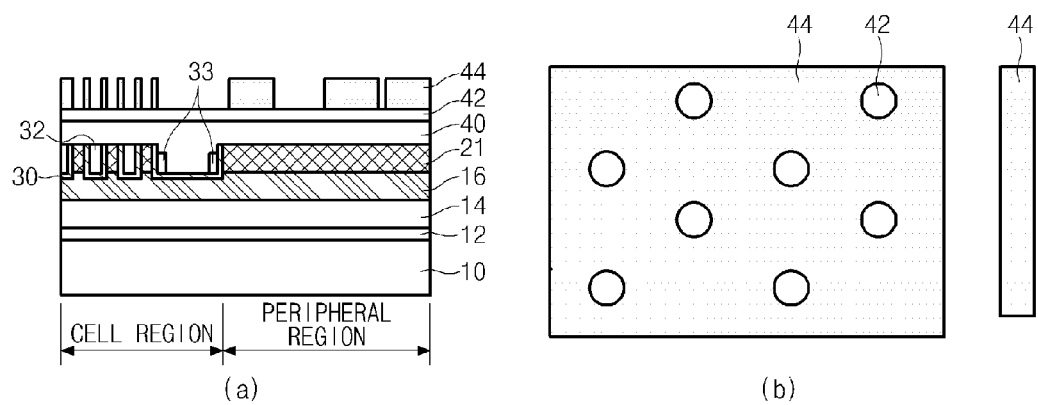

As shown in FIG. 5c, a dielectric interlayer 40, an anti-reflection layer 42, and a photoresist pattern 44 are formed without removing the remaining spacer oxide layer 30. The photoresist pattern 44 of FIG. 5c has the same shape as the photoresist pattern 44 of FIG. 4g. Accordingly, the photoresist pattern 44 cuts and separates the sacrificial film patterns 21 of a line and space type and the gap-fill layer 32 in the cell region, and etches the patterns 21 of a pad type in the peripheral region, thus patterning elements, such as a sense amplifier, which will be formed in the peripheral region.

Figure 5D:
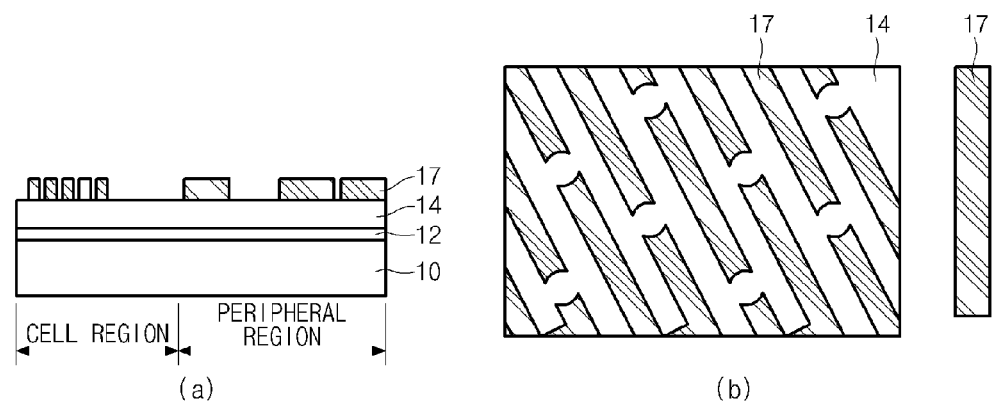

Referring to FIG. 5d, the dielectric interlayer 40 is etched and removed using a method, such as $O_2$ plasma strip. The oxide layer spacer 30 between the gap-fill layer 32 and the sacrificial film patterns 21 is removed. The oxide layer spacer 30 between the gap-fill polysilicon residue 33 and the sacrificial film patterns 2 is removed as well. Then, the oxide layer 16 is patterned using the sacrificial film patterns 21 and the gap-fill layer 32 as a mask, thereby forming an oxide layer pattern 17, such as that shown in FIG. 5d. FIG. 5d is identical with FIG. 4i. Subsequent processes are identical with those of the second embodiment 2, and a description thereof is omitted.

In the third embodiment described so far, the process of removing the oxide layer spacer 30 shown in FIGS. 4e and 4f in the second embodiment is omitted, and then, in the process of etching the oxide layer 16, the oxide layer spacer 30 is removed. Accordingly, the process can be simplified and the manufacturing cost can be further reduced as compared with the second embodiment.

(4) Embodiment 4

Negative Spacer Patterning Process (Control Gap Between Cell Region and Peripheral Region FIGS. 6a to 6e are cross-sectional views and plan views showing a fourth embodiment according to a negative spacer patterning process in the method of forming the fine patterns of a semiconductor device according to the present invention. The fourth embodiment to be described later may not generate the gap-fill polysilicon residue 33 (refer to FIG. 4e) by controlling the gap between the cell region and peripheral region patterns while using the negative spacer patterning process.

Figure 6A:
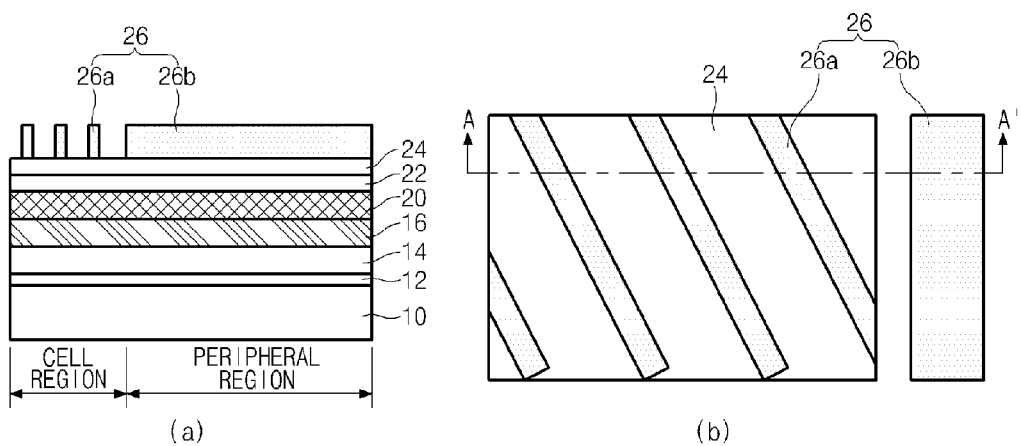
FIGS. 6a to 6e are cross-sectional views and plan views showing a fourth embodiment according to a negative spacer patterning process in the method of forming the fine patterns of a semiconductor device according to the present invention.
Figure 6B:
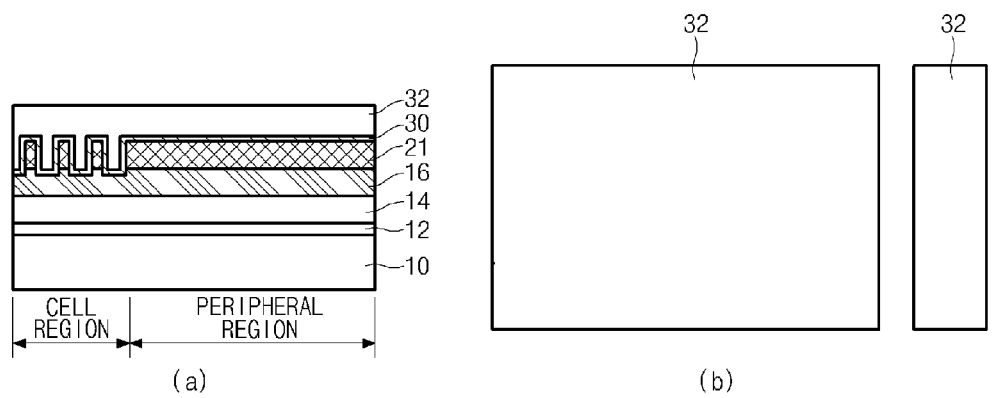

The elements shown in FIG. 6a are identical with those shown in FIG. 4a except that the gap between the photoresist patterns 26 of the cell region and the peripheral region is controlled to have a specific width. In more detail, the width of a space formed between the photoresist pattern 26a of a line type, placed at the outermost portion of the cell region, and the photoresist pattern 26b of a pad type, placed in the peripheral region, is about three times larger than the width of the photoresist pattern 26a of a line type. The width of the photoresist pattern 26a is as narrow as equal to the critical dimension. That is, the gap between the photoresist patterns 26 of the cell region and the peripheral region is reduced as compared with the second or third embodiment.

Next, in the same method as shown in FIGS. 4b to 4d, the sacrificial film patterns 21 are formed. The oxide layer spacers 30 and the gap-fill polysilicon 32 are then deposited, thereby completing a semiconductor device having a structure shown in FIG. 6b. That is, the gap-fill polysilicon 32 having as wide as shown in either the second or the third embodiment is not formed because the space between the sacrificial layer 21 of a line type, placed at the outermost portion of the cell region, and the pad pattern 21 of the peripheral region is as narrow as the space between the sacrificial layer 21 and the oxide layer spacer 30 in the cell region.

Figure 6C:
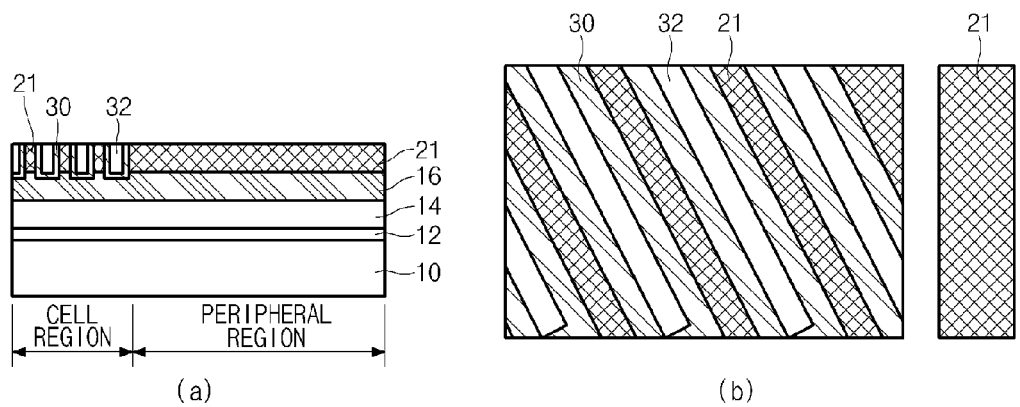

Next, even after the process of removing the gap-fill polysilicon 32 and a top surface of the spacer oxide layer 30 is performed, the gap-fill polysilicon residue does not remain between the cell region and the peripheral region as shown in FIG. 6c.

Figure 6D:
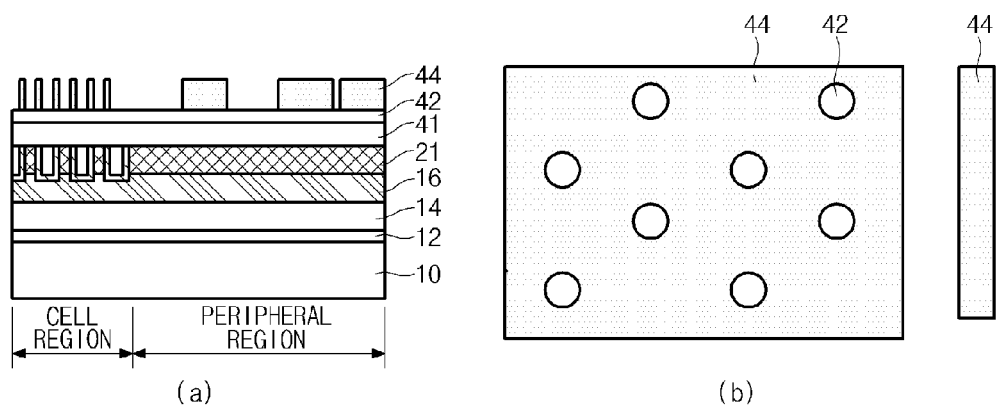

Referring to FIG. 6d, the dielectric interlayer 40, the anti-reflection layer 42, and the photoresist pattern 44 are formed. The sacrificial film patterns 21 and the gap-fill polysilicon 32 are then separated into several pieces using the photoresist pattern 44 as a mask. At this step, no gap-fill polysilicon residue exists that needs to be removed when the sacrificial film patterns 21 and the gap-fill polysilicon 32 are cut and separated. Accordingly, the process can be further simplified as compared with the second and third embodiments.

Figure 6E:
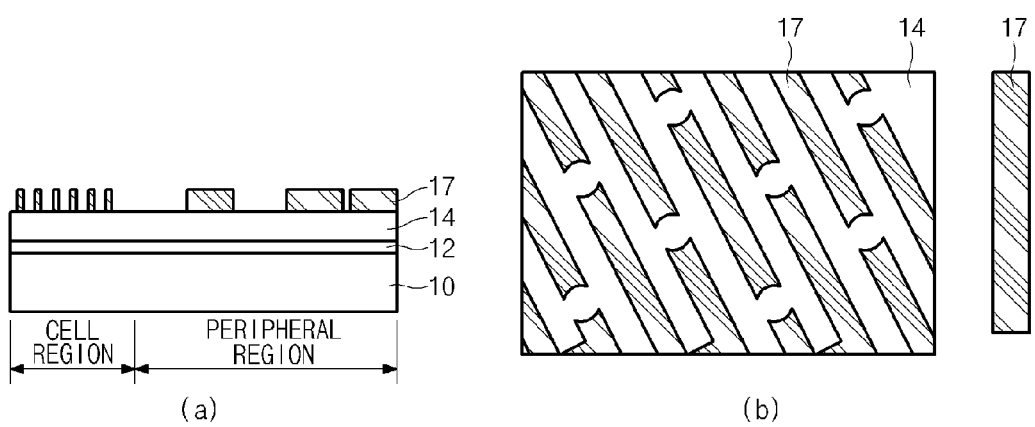

Referring to FIG. 6e, in the same manner as described in FIG. 5d, the oxide layer 16 is patterned using the sacrificial film patterns 21 and the gap-fill layer 32 as a mask, thereby forming an oxide layer pattern 17.

Meanwhile, in the fourth embodiment, as with the third embodiment, the spacer oxide layer 30 is removed at a late stage, i.e., after the gap-fill polysilicon 32 and the sacrificial film patterns 21 are separated into several pieces. However, the spacer oxide layer 30 can be fully removed at an earlier state like as the second embodiment, i.e., after the etchback process to form the gap-fill polysilicon pattern 32. (see FIG. 4f)

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method of forming fine patterns over a semiconductor device, the method comprising:
    forming a target layer over a semiconductor substrate;
    forming a first sacrificial film pattern over the target layer in a cell region of the semiconductor substrate and a second sacrificial film pattern in a peripheral region of the semiconductor substrate;
    forming spacers over first and second sidewalls of the first sacrificial film pattern and the second sacrificial pattern, respectively;
    forming a gap-fill pattern between adjacent spacers, wherein the gap-fill pattern fills a space between the adjacent spacers;
    removing a portion of the spacer that is between the first sacrificial film pattern and the gap-fill pattern, and a portion of the spacer that is between the second sacrificial film pattern and the gap-fill pattern; and
    patterning the target layer using the first sacrificial film pattern and the gap-fill pattern as an etch mask to form a target pattern.

2. The method according to claim 1, the forming the spacers comprising:
    forming a spacer layer over the first and second sacrificial patterns; and
    removing a portion of the spacer layer provided over upper surfaces of the first and the second sacrificial patterns while leaving a portion of the spacer layer provided over the sidewalls of the first and the second sacrificial patterns to form the spacers.

3. The method according to claim 1, wherein the forming the gap-fill pattern between the adjacent spacers comprises:
    depositing a gap-fill layer over the semiconductor substrate including the spacers; and
    planarizing the gap-fill layer so that the gap-fill layer remains between the spacers and not above the spacers.

4. The method according to claim 1, wherein the removing the portions of the spacers is performed using either dry etch or wet etch.

5. The method according to claim 1, wherein the target layer is an oxide layer.

6. The method according to claim 1, wherein the forming the gap-fill pattern between the spacers comprises:
    depositing a gap-fill layer over the spacers; and
    planarizing the gap-fill layer using an etchback process so that the gap-fill layer remains between the spacers while removing the gap-fill layer provided over the spacers.

7. The method according to claim 1, wherein the first and the second sacrificial film patterns comprise polysilicon, respectively.

8. The method according to claim 1, further comprising etching the semiconductor substrate using the target pattern as a mask to form a trench in the substrate.

9. The method according to claim 1, wherein the first sacrificial film pattern is a line-and-space type pattern, and a width ratio of a line and a space is 1:3, and a line width of the first sacrificial film pattern is substantially the same as a given critical dimension.

10. The method according to claim 1, wherein a line width of the spacer is substantially the same as a line width of the first sacrificial film pattern.

11. The method according to claim 10, wherein a line width of the gap-fill pattern is substantially the same as the line width of the first sacrificial film pattern.

12. The method according to claim 1, wherein a space width between the first sacrificial film pattern at an outer side of the cell region and the second sacrificial film pattern in the peripheral region is about 3 times wider than a line width of the first sacrificial film pattern.

13. The method according to claim 1, wherein the adjacent spacers define a lateral distance therebetween, the gap-fill pattern having a width that is substantially equal to the lateral distance so that the gap-fill pattern fills the space between adjacent spacers.

14. A method of forming fine patterns over a semiconductor device, the method comprising:
forming a target layer over a semiconductor substrate;
forming a first sacrificial film pattern over the target layer in a cell region of the semiconductor substrate and a second sacrificial film pattern in a peripheral region of the semiconductor substrate;
forming spacers over first and second sidewalls of the first sacrificial film pattern and the second sacrificial pattern;
forming a gap-fill pattern between adjacent spacers, wherein the gap-fill pattern fills a space between the adjacent spacers;
removing a portion of the spacer that is between the first sacrificial film pattern and the gap-fill pattern, and a portion of the spacer that is between the second sacrificial film pattern and the gap-fill pattern; and
patterning the target layer using the first sacrificial film pattern and the gap-fill pattern as an etch mask to form a target pattern,
wherein the method further comprises:
patterning the first sacrificial film pattern to form a third sacrificial film pattern; and
patterning the second sacrificial film pattern to form a fourth sacrificial film pattern,
wherein the target layer in the cell region and the peripheral region is patterned using the third and the fourth sacrificial film patterns and the gap-fill pattern.

15. The method according to claim 14, wherein the forming the third and the fourth sacrificial film patterns are concurrently performed.

16. The method according to claim 15, wherein the first sacrificial film pattern is a line type pattern and the second sacrificial film pattern is a pad type pattern, and
wherein the first sacrificial film pattern is patterned to form a plurality of the third sacrificial film patterns, each third sacrificial film pattern being a line type pattern.

17. The method according to claim 15, wherein the patterning the first and the second sacrificial film patterns are concurrently formed.

18. The method according to claim 17, wherein the removing the portions of the spacers is performed after concurrently patterning the first and the second sacrificial film patterns.

19. The method according to claim 14, wherein a gap-fill residue is formed over sidewalls of the spacer between the first sacrificial film pattern and the second film pattern, and
wherein the gap-fill residue is removed when the first and second sacrificial film patterns are concurrently patterned into the third and the fourth sacrificial film patterns, respectively.

20. The method according to claim 14, wherein the patterning the first sacrificial pattern to form a third sacrificial pattern is performed using a mask having a hole pattern.

* * * * *